US010687005B2

(12) United States Patent
Canniff et al.

(10) Patent No.: US 10,687,005 B2
(45) Date of Patent: Jun. 16, 2020

(54) ANALOG-TO-DIGITAL CONVERTERS FOR PHASE-DETECTION AUTOFOCUS IMAGE SENSORS

(71) Applicant: Analog Devices Global Unlimited Company, Hamilton (BM)

(72) Inventors: Daniel Peter Canniff, Brookline, MA (US); Edward C. Guthrie, Charlestown, MA (US); Jonathan Ephraim David Hurwitz, Edinburgh (GB)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 45 days.

(21) Appl. No.: 16/127,553

(22) Filed: Sep. 11, 2018

(65) Prior Publication Data

US 2019/0182445 A1 Jun. 13, 2019

Related U.S. Application Data

(60) Provisional application No. 62/598,065, filed on Dec. 13, 2017.

(51) Int. Cl.
*H04N 5/369* (2011.01)
*H03M 1/46* (2006.01)
(Continued)

(52) U.S. Cl.
CPC .......... *H04N 5/36961* (2018.08); *H03M 1/46* (2013.01); *H03M 1/462* (2013.01); *H04N 5/378* (2013.01); *H04N 5/37455* (2013.01)

(58) Field of Classification Search
CPC .......... H04N 5/36961; H04N 5/37455; H04N 5/378; H03M 1/462; H03M 1/46
See application file for complete search history.

(56) References Cited

U.S. PATENT DOCUMENTS 6,097,022 A 8/2000 Merrill et al.
6,410,899 B1 6/2002 Merrill et al.
(Continued)

FOREIGN PATENT DOCUMENTS

EP 2840780 2/2015
JP 2005-336450 12/2005
(Continued)

OTHER PUBLICATIONS

Nie et al., *A fast correlated multiple sampling technique based on 12-bit SAR DAC with digital calibration for low-noise CMOS image sensor*, Microelectronics Journal 59 (2017), 8 pages.
(Continued)

*Primary Examiner* — Ahmed A Berhan
(74) *Attorney, Agent, or Firm* — Patent Capital Group

(57) ABSTRACT

Embodiments of the present disclosure provide ADCs particularly suitable for PDAF image sensors, which ADCs may have an increased speed and/or reduced design complexity and power consumption compared to conventional implementations. An example ADC for a PDAF image sensor is configured to implement modified SAR techniques which reduce the number of bit trials required for conversion, and enable increased number of samples in a row-conversion time period of the image sensor. The ADC may implement the modified SAR techniques in combination with CMS in pixel readout signal chain, which may reduce noise without a proportionate increase in ADC sample rate.

20 Claims, 5 Drawing Sheets

(51) Int. Cl.
*H04N 5/3745* (2011.01)
*H04N 5/378* (2011.01)

(56) References Cited

U.S. PATENT DOCUMENTS

| | | | |
|---|---|---|---|
| 7,312,734 | B2 | 12/2007 | McNeill et al. |
| 7,577,349 | B2 | 8/2009 | Inoue et al. |
| 7,605,854 | B2 | 10/2009 | Terzioglu |
| 7,649,488 | B1 | 1/2010 | Johansson |
| 8,130,302 | B2 | 3/2012 | Johnson |
| 8,390,501 | B2* | 3/2013 | Chang .................. H03M 1/462 341/155 |
| 8,405,017 | B2 | 3/2013 | Neter et al. |
| 8,614,755 | B2 | 12/2013 | Takamiya et al. |
| 8,692,928 | B2 | 4/2014 | Yamasaki |
| 8,730,374 | B2 | 5/2014 | Sugawara |
| 9,185,273 | B2 | 11/2015 | Beck et al. |
| 9,288,382 | B2 | 3/2016 | Fujii et al. |
| 9,338,344 | B2 | 4/2016 | Nakamura |
| 9,338,380 | B2 | 5/2016 | Milnar |
| 9,571,114 | B1 | 2/2017 | Shen et al. |
| 2010/0283881 | A1 | 11/2010 | Yuichiro et al. |
| 2013/0002925 | A1* | 1/2013 | Lin ........................ G02B 26/02 348/333.08 |
| 2013/0229543 | A1 | 9/2013 | Hashimoto et al. |
| 2015/0062396 | A1 | 3/2015 | Yamaoka |
| 2015/0312461 | A1 | 10/2015 | Kim et al. |
| 2016/0118423 | A1* | 4/2016 | Yamazaki ......... H01L 27/14609 257/43 |

FOREIGN PATENT DOCUMENTS

| | | |
|---|---|---|
| JP | 2013-211832 | 10/2013 |
| JP | 2014-195129 | 10/2014 |
| JP | 2015-023391 | 2/2015 |
| WO | 2017/077899 | 5/2017 |

OTHER PUBLICATIONS

Wood et al., *Predicting ADC: A New Approach for Low Power ADC Design*, 978-1-4799-5924-2 © 2014 IEEE, 4 pages.

Dyachenko, *A Low Power 10-bit SAR ADC in a 45nm CMOS process*, TU Delft, Delft University of Technology, Faculty of Electrical Engineering, Mathematics and Computer Science, Electronic Instrumentation Laboratory, Jul. 10, 2012, 71 pages.

Chiang et al., *A Signal-Specific Approach for Reducing SAR-ADC Power Consumption*, 978-1-4799-1471-5 © 2013 IEEE Biomedical Circuits and Systems Conference, 4 pages.

Cevik et al., *An Ultra-Low Power CMOS Image Sensor with On-Chip Energy Harvesting and Power Management Capability*, Sensors 2015, 15, doi: 10.3390/s150305531, 24 pages.

Choi, *An Energy-efficient Adaptive CMOS Image Sensor*, Dissertation, University of Michigan, 2013, 174 pages.

Wang et al., *An 89dB Dynamic Range CMOS Image Sensor with Dual Transfer Gate Pixel*, 2011 International Image Sensor Workshop, Jun. 8-11, 2011, Hokkaido, Japan, 4 pages.

Seo et al., *A 0.27e rms Read Noise 220-μV/e- Conversion Gain Reset-Gate-Less CMOS Image Sensor With 0.11-μm CIS Process*, IEEE Electron Device Letters, vol. 36, No. 12, Dec. 2015, 4 pages.

Snoeij et al., *Multiple-Ramp Column-Parallel ADC Architectures for CMOS Image Sensors*, IEEE Journal of Solid-State Circuits, vol. 42, No. 12, Dec. 2007, 10 pages.

Yaul et al., *A 10 bit SAR DAC With Data-Dependent Energy Reduction Using LSB-First Successive Approximation*, IEEE Journal of Solid-State Circuits, vol. 49, No. 12, Dec. 2014, 10 pages.

Kobayashi et al., *A Low Noise and High Sensitivity Image Sensor with Imaging and Phase-Difference Detection AF in All Pixels*, 2015 International Image Sensor Workshop, Jun. 8-11, 2015, Vaals, The Netherlands, 4 pages.

Akahane et al., *Optimum Design of Conversion Gain and Full Well Capacity in CMOS Image Sensor with Lateral Overflow Integration Capacitor*, IEEE Transactions on Electron Devices, vol. 56, No. 11, Nov. 2009, 7 pages.

*Canon Dual Pixel CMOS AF shows us what Olympus-Panasonic will have to do*, Jul. 2, 2013, retrieved from https://www.43rumors.com/canon-dual-pixel-cmos-af-shows-us-what-olympus-panasonic-will-have-to-do/, 5 pages.

Findlater et al., *SXGA Pinned Photodiode CMOS Image Sensor in 035μm Technology*, ISSCC 2003, Session 12, CMOS Imagers, Sensors and Displays, Paper 12.4, 10 pages.

McNeill et al., *All-Digital Background Calibration of a Successive Approximation ADC Using the 'Split ADC' Architecture*, IEEE Transactions on Circuits and Systems-I: Regular Papers, vol. 58, No. 10, Oct. 2011, 11 pages.

International Search Report and Written Opinion issued in PCT/EP2017/064326 dated Nov. 29, 2017, 21 pages.

English Abstract for JP2015-023391 (Google Translate), see 4 above.

English Abstract for JP2005-336450 (Google Translate), see 5 above.

English Abstract for JP2014-195129 (Google Translate), see 6 above.

* cited by examiner

ANALOG-TO-DIGITAL CONVERTERS FOR PHASE-DETECTION AUTOFOCUS IMAGE SENSORS

CROSS REFERENCE TO RELATED APPLICATIONS

This application claims the benefit of and priority from U.S. Provisional Patent Application Ser. No. 62/598,065 filed 13 Dec. 2017, entitled "ANALOG-TO-DIGITAL CONVERTERS FOR PHASE-DETECTION AUTOFOCUS IMAGE SENSORS", incorporated herein by reference in its entirety.

TECHNICAL FIELD OF THE DISCLOSURE

The present disclosure relates generally to analog-to-digital converters and, more particularly, to techniques for increasing analog-to-digital conversion speed in phase-detection autofocus image sensors, as well as related devices and systems.

BACKGROUND

Real-world analog signals such as temperature, pressure, sound, or light are routinely converted to a digital representation that can be easily processed in modern digital signal processing systems. The circuits that perform this conversion of an analog input signal to a digital output signal are analog-to-digital converters (ADCs). ADCs can translate analog electrical signals representing real-world phenomena such as temperature, pressure, sound, or light to digital signals for data processing purposes.

Designing an ADC is a non-trivial task because each application may have different needs in speed, performance, power, cost and size. As the applications needing ADCs grow, the need for fast, accurate, and reliable conversion performance also grows.

One application where ADCs are used are image sensors, or cameras, implementing phase-detection autofocus (PDAF). Such image sensors are also known as "dual pixel" image sensors.

When a PDAF camera acquires an image, light incident on the light sensors (e.g., photodetectors) of the camera is converted to charge, which charge is accumulated in the light sensors. Voltage representative of the charges accumulated on the light sensors may then be read out, possibly amplified using an amplifier, and analog values representing the voltages may be converted to digital values by an ADC. In some implementations, a technique known as "correlated multiple sampling" (CMS) may be implemented as the charges on photodiodes are converted to digital values, in order to minimize the noise contribution. In general, CMS is a sampling method used with complementary metal oxide semiconductor (CMOS) image sensors, based on repeatedly integrating and averaging the photodiode output in the analog domain.

Increasing the speed at which ADCs perform the necessary conversions in PDAF image sensors is always desirable.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
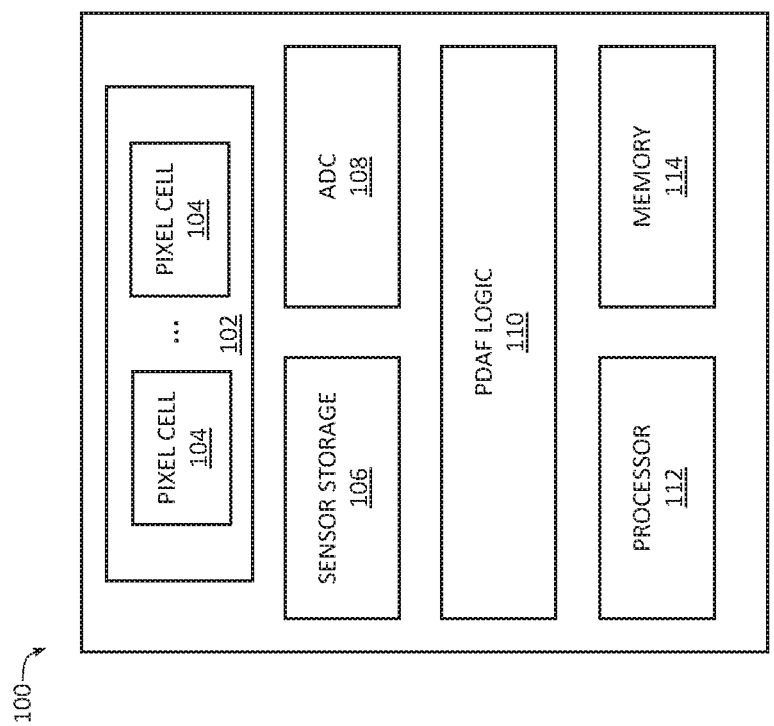
FIG. 1 provides a schematic illustration of a PDAF image sensor, camera, according to some embodiments of the present disclosure.

Embodiments of the present disclosure provide ADC systems particularly suitable for PDAF cameras, which ADC systems may have an increased speed and/or reduced design complexity and power consumption compared to conventional implementations.

One aspect of the present disclosure provides an ADC for a PDAF image sensor. The ADC is configured to implement modified SAR techniques (referred to in the following as "adaptive SAR" techniques) which reduce the number of bit trials required for conversion, and enable increased number of samples in a row-conversion time period of the image sensor. The ADC may implement the adaptive SAR techniques in combination with CMS in pixel readout signal chain, which may reduce noise without a proportionate increase in ADC sample rate. Accordingly, an example PDAF image sensor system may include an array of pixel cells configured to acquire an image, each pixel cell comprising a first and a second light sensor (e.g., a first and a second photodetector), and an ADC configured to determine, for each of one or more of the pixel cells, a first N-bit digital value representative of a first analog voltage value indicative of a charge detected by the first light sensor, where N is an integer greater than 1, and a second N-bit digital value representative of a second analog voltage value indicative of a charge detected by the second light sensor. Such determination may include determining the first N-bit digital value by applying a first SAR algorithm to determine N bits of the first N-bit digital value, and determining the second N-bit digital value by applying a second SAR algorithm to determine only M least significant bits (LSB) of the second N-bit digital value, and combining the M LSB of the second N-bit digital value with (N-M) most significant bits of the first N-bit digital value to generate the second N-bit digital value, where M is an integer equal to or greater than 1.

As will be appreciated by one skilled in the art, aspects of the present disclosure, in particular aspects of adaptive SAR analog-to-digital conversion in PDAF image sensors proposed herein, may be embodied in various manners—e.g., as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more processing units, e.g., one or more microprocessors, of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g., to the existing PDAF image sensors, ADCs, and/or controllers of PDAF image sensors and their ADCs, etc.) or be stored upon manufacturing of these devices and systems.

Other features and advantages of the disclosure are apparent from the following description, and from the claims.

Basics of ADCs

ADCs are electronic devices that convert a continuous physical quantity carried by an analog signal to a digital number that represents the quantity's amplitude (or to a digital signal carrying that digital number). The conversion involves quantization of the analog input signal, i.e., a process of mapping input values from a continuous set of analog values to output values in a countable smaller set of digital values, so it would introduce a small amount of error. Typically the quantization occurs through periodic sampling of the analog input signal. The result is a sequence of digital values (i.e., a digital signal) that represents conversion of a continuous-time and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal to noise ratio (SNR), signal-to-noise-and-distortion ratio (SINAD), effective number of bits (ENOB), total harmonic distortion (THD), total harmonic distortion plus noise (THD+N), and spurious free dynamic range (SFDR). ADCs have many different designs, which can be chosen based on the application requirements and performance specifications.

There are many types of ADC technologies such as SAR ADCs, flash ADCs, sigma-delta ADCs, etc. These different styles of converters may be used in combination. In some converter topologies, an input signal is sampled onto a capacitor or an array of capacitors commonly referred to as "sampling capacitors" prior to the analog to digital conversion taking place. During the sampling operation, charge is exchanged between the sampling capacitor(s) and a circuit driving the sampling capacitor(s) so that the sampling capacitor(s) are charged to a voltage corresponding to the value of the input signal at that time. The driving circuit typically has an impedance such that it takes time to charge and discharge the sampling capacitor to its correct voltage. Terms such as "acquisition/acquire phase" or "sampling phase" may be used to describe a phase, i.e., a time period, when sampling capacitor(s) connected to an input node at which the input signal is received are being charged to a voltage corresponding to the input voltage. In other words, "acquire phase" or "sampling phase" refer to a time period when sampling capacitor(s) are sampling an analog input signal in order to convert the analog input signal to a digital output signal. Terms "sampling" and "acquire phase" may be used interchangeably to refer to the action of one or more sampling capacitors connected to an input node sampling or acquiring an input signal during a certain time period. An acquire phase is followed, which may but does not have to be in immediate succession (i.e., may or may not be done consecutively), by a phase that is typically referred to as a "conversion phase," where an analog value of the input signal sampled on the sampling capacitor(s) is converted to a digital value by comparison of the charge accumulated on the sampling capacitor(s) with one or more reference voltage values. After acquisition and conversion phases for converting one analog input value are finished, processing described above is repeated for the next analog input value.

SAR ADCs are suited for use in PDAF image sensors due to low power consumption, the use of mostly dynamic circuits which scale with supply voltage and are the absence of any linear amplifiers, make it suited to deep sub-micron CMOS processes. In addition SAR ADC allow an efficient tradeoff between power, noise and speed in image sensors which require different ADC specifications to meet high-frame rate, fast autofocus, and low noise operating modes. A SAR ADC is a type of ADC that converts a continuous analog waveform into a discrete digital representation via a binary search through all possible quantization levels before finally converging upon a digital output for each conversion PDAF Image Sensors FIG. 1 provides a schematic illustration of a PDAF image sensor 100, or a PDAF camera 100, according to some embodiments of the present disclosure. As shown in FIG. 1, the PDAF image sensor 100 may include an array 102 of pixel cells 104, a sensor storage 106, an ADC 108, a PDAF logic 110, a processor 112, and a memory 114.

Within the array 102, pixel cells 104 may be arranged in rows and columns. Each pixel cell 104 may include two or more light sensors, where each light sensor may include a photodetector, e.g., a photodiode, or any suitable optical/light sensor photodetector. In other words, in the PDAF image sensor 100, each pixel cell 104 may be seen as being split into two or more sub-pixels. When the PDAF image sensor 100 acquires an image, light incident on the two or more light sensors of each of the pixel cells 104 is converted to charge.

The sensor storage 106 may include any array of storage elements configured to store values indicative of the readings of the light sensors of the pixel cells 104. In some embodiments, the sensor storage 106 may include an array of capacitors, where voltage on each capacitor is indicative of the light reading of a particular light sensor of a pixel cell 104.

The ADC 108 may include a SAR ADC configured to apply a suitable SAR technique, including adaptive SAR techniques as described herein, to convert analog values representing charges accumulated by the light sensors of the pixel cells 104 to digital values.

The PDAF logic 110, which may be implemented in hardware, software, firmware, or any suitable combination of the one or more of these, is configured to control the operation of the PDAF image sensor 100. To that end, the PDAF logic 110 may include at least one processor 112 and at least one memory element 114, along with any other suitable hardware and/or software to enable its intended functionality in a PDAF image sensor system as described herein. Thus, although shown as separate elements in FIG. 1, the processor 112 and/or the memory 114 may be considered to be a part of the PDAF logic 110.

In some embodiments, the processor 112 can execute software or an algorithm to perform the activities as discussed in this specification. The processor 112 may be configured to communicatively couple to other system elements via one or more interconnects or buses. Such a processor may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (ASIC), or a virtual machine processor. The processor 112 may be communicatively coupled to the memory element 114, for example in a direct-memory access (DMA) configuration. Such a memory element may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory items discussed herein should be construed as being encompassed within the broad term "memory element." The information being tracked or sent to the PDAF lagic 110, the pixel cells 104, the sensor storage 106, the processor 112, or the memory 114 could be provided in any database, register, control list, cache, or storage structure, all of which can be referenced at any suitable timeframe. Any such storage options may be included within the broad term "memory element" as used herein. Similarly, any of the potential processing elements, modules, and machines described herein should be construed as being encompassed within the broad term "processor." Each of the elements shown in FIG. 1, e.g., the PDAF logic 110 and the sensor storage 106, can also include suitable interfaces for receiving, transmitting, and/or otherwise communicating data or information in a network environment.

In certain example implementations, mechanisms for adaptive SAR conversion in PDAF systems as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, e.g., the memory 114 shown in FIG. 1, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, e.g., the processor 112 shown in FIG. 1, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The PDAF image sensor 100 operates by detecting differences in light intensity captured by different light sensors of a given pixel cell 104, for substantially all pixel cells of the array 102. The PDAF image sensor 100 may be a CMOS or a charge-coupled device (CCD) image sensor. In many applications, micro-lenses may be placed on top of a pixel or a group of pixels of the array 102 to improve the collection efficiency of the light. The sum of the signals received by split sub-pixels of a pixel cell 104 corresponds substantially to the image data, whereas the difference of the signals received by split pixels may be used to determine the focus of the image.

PDAF image sensors such as the PDAF image sensor 100 typically operate in one of two modes. The first mode is a standard imaging readout mode, and the second is an autofocus readout mode, where the mode of operation may be controlled by the PDAF logic 110, e.g., responsive to receiving user input regarding desired mode of operation, or the suitable mode of operation can be automatically determined by the PDAF logic 110. In the imaging readout mode, the values from the multiple light sensors of each pixel cell 104 may be averaged together, as if the pixel cell 104 had a single light sensor, e.g., a single photodetector. In the autofocus readout mode, the multiple light sensor samples are not averaged but read out separately and used later to determine the phase relationship of objects in a scene, and, therefore, how to adjust the autofocus system to achieve a fast and accurate focus point. In the dual pixel design readout, either in imaging mode or autofocus mode, there are at least 3 samples: a reset sample, a sample from a first light sensor (referred to in the following as a "photodetector A" (PD-A)) of a pixel cell, and a sample from a second light sensor (referred to in the following as a "photodetector B" (PD-B)) of a pixel cell.

Adaptive SAR Techniques for PDAF Image Sensors

Figure 2:
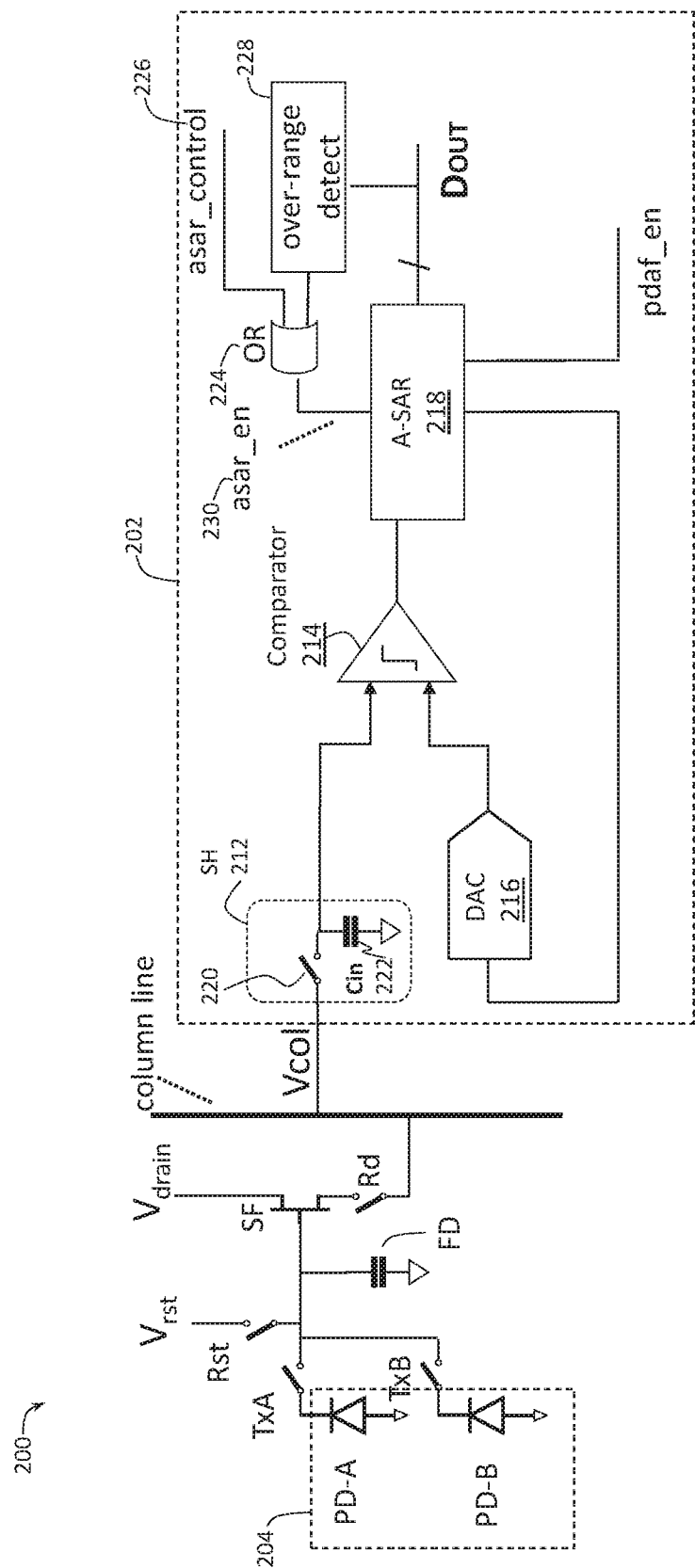
FIG. 2 illustrates an example circuit diagram of a portion of a PDAF image sensor with an ADC configured to implement adaptive successive approximation register/routine (SAR) techniques to generate digital values based on light sensor readings of the PDAF image sensor, according to some embodiments of the present disclosure.

FIG. 2 illustrates an example circuit diagram 200 of a portion of a PDAF image sensor, e.g., the PDAF image sensor 100 shown in FIG. 1, illustrating an ADC 202 configured to implement adaptive SAR techniques to generate digital values based on light sensor readings of the PDAF image sensor, according to some embodiments of the present disclosure. The ADC 202 may be used as the ADC 108 shown in FIG. 1.

Besides the ADC 202, FIG. 2 further illustrates a pixel cell 204, which could e.g., be one of the pixel cells 104 shown in FIG. 1, where the pixel cell 204 is connected to the ADC 202 using switches and a voltage buffer. The switches are shown as a transfer gate transistor A (TxA) connecting PD-A to the floating diffusion capacitance (FD), transfer gate transistor B (TxB) connecting PD-B to the floating diffusion capacitance (FD), reset gate transistor (Rst), and row select transistor (Rd), and the voltage buffer is shown as the source follower (SF) which connects the FD to the column line. The pixel is connected to the floating diffusion capacitance FD through the switches TxA and TxB. In some embodiments, one of more of such switches, transistors, capacitances, and voltage buffers as shown in FIG. 2 between the pixel cell 204 and the ADC 202 may be considered to be a part of the pixel cell 204.

Also shown in FIG. 2, when the pixel cell 204 is being readout, either in the imaging readout or autofocus readout modes, analog voltage shown in FIG. 2 as "Vcol" is provided to the ADC 202 for conversion to a digital value which is then output from the ADC 202, the output digital value is shown in FIG. 2 as "Dou1."

The ADC 202 may include four components common for SAR ADCs—namely, an input sample-and-hold (SH) stage 212, which may include a SH amplifier (SHA), an analog comparator 214, a reference digital-to-analog converter (DAC) 216, and a SAR logic 218. The SAR logic 218 is configured to implement, or control implementation of, adaptive SAR techniques as described herein, and, therefore, is shown in FIG. 2 as "A-SAR" 218. In some embodiments, the A-SAR logic 218 may be a part of the PDAF logic 110 shown in FIG. 1, or vice versa. Accordingly, descriptions provided above for the PDAF control logic 110 are applicable to the A-SAR 218 and, in the interests of brevity, are not repeated.

The ADC 202 may function as follows. After power-up, from a power supply, and initialization, a control signal which may e.g., be provided by the A-SAR 218, starts the conversion cycle. The switch 220 closes, connecting the analog input Vcol to the SH 212, which acquires the input voltage on its' sampling capacitor (which may include an array of sampling capacitors) Cin 222. When the switch 220 opens, the comparator 214 determines whether the analog input, which is now stored on the hold capacitor Cin 222, is greater than or less than the DAC voltage from the reference DAC 216. In a conventional SAR implementation, to start, the most significant bit (MSB) is on, setting the DAC output voltage to midscale. After the comparator output has settled, the SAR logic turns off the MSB if the DAC output was larger than the analog input, or keeps it on if the output was smaller. The process repeats with the next MSB, turning it off if the comparator determines that the DAC output is larger than the analog input, or keeping it on if the output was smaller. This binary search continues until every bit in the register is tested. The resulting DAC output is a digital approximation of the sampled input voltage, and is output by the ADC 202 at the end of the conversion.

Unlike the conventional SAR implementation, the ADC 202 may further include an OR logic gate 224 configured to receive asar_control signal 226 and an output signal from an over-range detect unit 228, and to provide a control signal asar_en 230 for controlling the A-SAR 218 to implement modified SAR techniques. In particular, the control signal asar_en 230 may be used to control whether the ADC 202 implements a conventional SAR algorithm where the SAR algorithm determines all N bits of an N-bit digital value representing the analog voltage Vcol, or whether the ADC 202 implements a modified SAR algorithm where the modified SAR algorithm determines only the M LSB bits of an N-bit digital value representing the analog voltage Vcol, and those LSB bits are then combined with (N-M) MSB bits obtained by other means.

In the PDAF image sensor readout (either in imaging readout mode or autofocus readout mode), there are at least 3 samples. The first is the reset sample, the second sample is from the light sensor A (shown as PD-A in FIG. 2) of a given pixel cell 204, and the third sample is from the light sensor B (shown as PD-B in FIG. 2) of the same pixel cell 204. When the PDAF image sensor 100 is operated in the imaging readout mode, then Vcol voltage be substantially similar between PD-A sample and PD-B sample. This characteristic of the readout architecture can be used to adapt the conventional SAR algorithm by making an assumption that for PD-B the initial bit trials for (N-M) MSB will produce the same result as was calculated in PD-A conversion (for which the conventional SAR algorithm was used to determine all N bits). Consequently, the adapted SAR algorithm may just determine the last M LSB by running the bit trials only for the M LSBs. Such an adapted SAR algorithm may be used for all samples from PD-B, which may e.g., be implemented by providing the corresponding asar_control signal 226 to the A-SAR 218. On the other hand, when a conventional SAR algorithm is to be implemented, the asar_control control signal 230 may be not enabled.

When the PDAF image sensor 100 is operated in the autofocus readout mode, then the Vcol voltage will be very similar between PD-A and PD-B when the image is in focus. Therefore, this characteristic of the PDAF architecture can be used to adapt the SAR algorithm, by making an assumption that for PD-B the initial (N-M) bit trials, i.e., the (N-M) MSB, will produce the same result. However when the image is not in focus, the corresponding PD-A and PD-B Vcol voltages will not be close in voltage, then the adapted SAR algorithm will not converge to the correct value and the sample will not be valid due to the ADC output Dout being out of range. In this case, which any suitable controller (e.g., the PDAF logic 110) could be configured to detect, a full N-bit digital value may be re-calculated using the conventional SAR algorithm for the next sample, in case CMS is used (since there will be multiple samples for PD-A and PD-B when the CMS is used). Those samples that do not converge (i.e., digital values which are determined to be invalid) will be discarded, and the regular SAR algorithm will be used for subsequent conversions. In some embodiments, any sample that does not converge due to being out of range can be dropped, and subsequent samples can be digitized using the conventional SAR algorithm.

In some embodiments, the ADC 202 may have an operating mode, where the ADC 202 implements a full conversion of PD-A (i.e., conventional SAR algorithm), followed by multiple M-bit trials for only the M LSBs for PD-A, and performing multiple M-bit trials for M LSBs for PD-B using the (N-M) MSB from the full conversion of PD-A. Effectively, this implements CMS with adaptive SAR as described herein.

Figure 3:
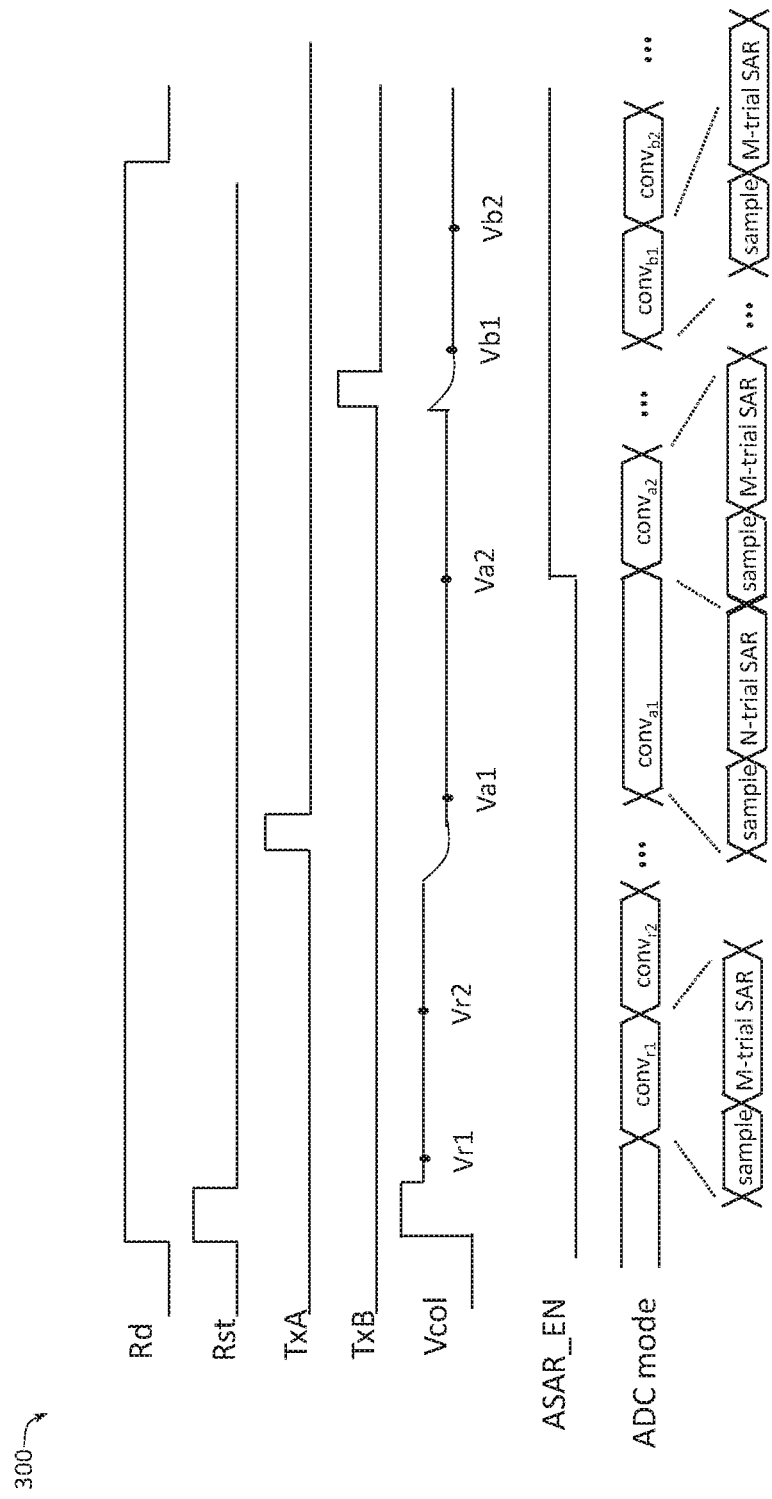
FIG. 3 illustrates an example timing diagram of the ADC as shown in FIG. 2 when the PDAF image sensor operates in the imaging readout mode, according to some embodiments of the present disclosure.

FIG. 3 illustrates an example timing diagram 300 of the ADC 202 as shown in FIG. 2 when the PDAF image sensor 100 operates in the imaging readout mode and the pixel cell 204 being readout is in focus, according to some embodiments of the present disclosure.

Each pixel cell readout, i.e., a readout of a given pixel cell 104/204, starts with the column select switch Rd (as shown in FIG. 2) closing, thus connecting the in-pixel SF to the column line. The Rd switch remains closed throughout the ADC conversion of the reset and PD voltages from PD-A and PD-B shown in FIG. 2.

After Rd closes, the reset switch Rst (also shown in FIG. 2) is closed, connecting the floating diffusion HD to the reset voltage Vrst (shown in FIG. 2), thus resetting the voltage at the floating diffusion capacitance.

The voltage, Vr, is sampled onto the Cin capacitor 222 shown in FIG. 2. Since the voltage Vr will be substantially similar to the voltage Vrst, the first (N-M) MSBs can be set to those that correspond to the known voltage range of Vrst. Then a reduced set of bit trials (M-trials) of the modified SAR algorithm can be used to complete the conversion of the last M LSBs. Multiple reset voltages may be sampled and converted during the reset readout phase using the ASAR algorithm to complete the CMS conversions. In FIG. 3, Vr1, Vr2, and so on, up to reset sample Vrx, correspond to the set of sampled reset voltage in the CMS conversion (i.e., X samples in a CMS conversion, where X is a positive integer). Each reset ADC conversion in the CMS corresponds to $conv_{r1}$, $conv_{r2}$, and so on, up to final reset conversion $conv_{rx}$. Each conversion phase, 'conv', has a sample phase followed by either a standard full N-bit SAR convert phase or M-bit Adaptive SAR phase.

Next, after the reset conversions are completed, switch TxA (shown in FIG. 2) closes, while the switch TxB is open. The integrated charge accumulated on PD-A is transferred to the floating diffusion FD at the gate of source follower, and then buffered by the SF onto the column line Vcol as the PD-A voltage level, then the switch TxA opens, and a standard full N-trial SAR ADC conversion is completed, this corresponds to $conv_{a1}$ in FIG. 3, $V_{a1}$ corresponds to the first sampled PD-A voltage level. Further M-trial conversion can then be completed in the CMS conversion, by sampling the PD-A voltage on Vcol, corresponding to $V_{a2}$, In FIG. 3, $conv_{a1}$, $conv_{a2}$, and so on, up to final PD-A conversion $conv_{ax}$, (not specifically shown in FIG. 3), correspond to the PD-A ADC conversions in the CMS sequence.

Once the PD-A ADC conversions are complete, next, the switch TxB closes, while the switch TxA is open. The integrated charge accumulated on PD-B is transferred to the floating diffusion FD at the gate of source follower, and then buffered by SF onto the column line Vcol as the PD-B voltage level, the TxB switch opens, and since, in the imaging readout mode, the voltage readout from PD-B should be substantially similar to PD-A, and the (N-M) MSBs can be set. This corresponds to $conv_{b1}$ in FIG. 3, $V_{b1}$ corresponds to the first sampled PD-B voltage level. Further M-trial conversions can then be completed in the CMS conversions, by sampling the PD-B voltage on Vcol, corresponding to $V_{b2}$. In FIG. 3, $conv_{b1}$, and $conv_{b2}$, and so on, up to final PD-B conversion $conv_{bx}$, (not specifically shown in FIG. 3), correspond to the PD-B ADC conversions in the CMS sequence.

Once the data level samples are complete, the average of the reset samples and the average of the PD-A and PD-B samples may be calculated. The difference between the average of the samples from PD-A and PD-B and the average of the reset sample is the final conversion result produced by the ADC 108.

Figure 4:
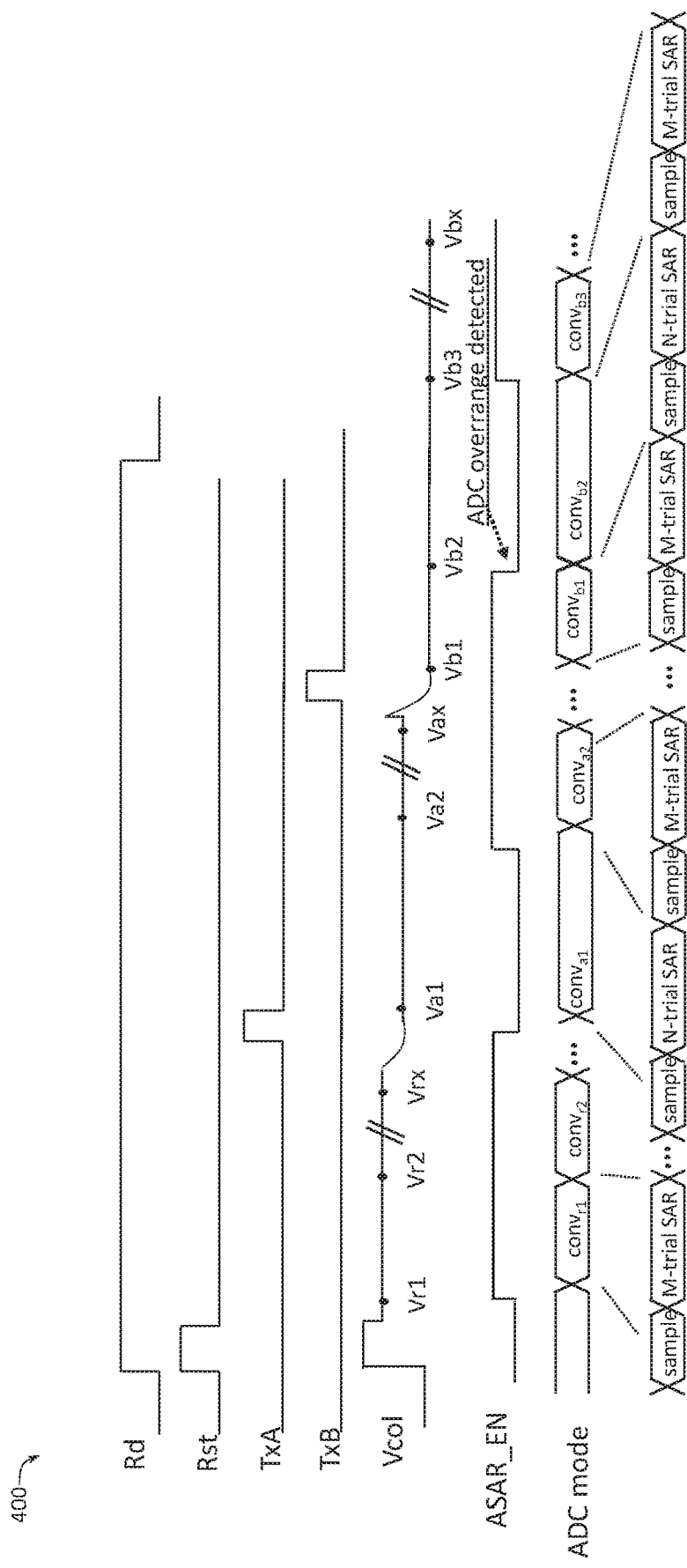
FIG. 4 illustrates an example timing diagram of the ADC as shown in FIG. 2 when the PDAF image sensor operates in the autofocus readout mode, according to some embodiments of the present disclosure.

FIG. 4 illustrates an example timing diagram 400 of the ADC 202 as shown in FIG. 2 when the PDAF image sensor 100 operates in the autofocus readout mode and the pixel cell 204 being readout is out of focus, according to some embodiments of the present disclosure.

Each pixel readout starts with the column select switch Rd closing, thus connecting the in-pixel SF to the column line node (shown in FIG. 2 as "column line"). The switch Rd remains closed throughout the ADC conversion of the reset and data voltages from PD-A and PD-B.

After the switch RD closes, the reset switch Rst is closed, connecting the floating diffusion to the reset voltage Vrst, thus resetting the voltage at the floating diffusion capacitance.

The voltage Vr is sampled onto the Cin capacitor 222. Since the voltage Vr will be substantially similar to the voltage Vrst, the first (N-M) MSBs can be set to those that correspond to the expected voltage range. Then a reduced set of bit trials (M-trials) of the modified SAR algorithm can be used to complete the conversion of the last M LSBs. This reduced set of bit trials (M) enabled a faster overall ADC conversion, allowing more reset conversions to be completed in fixed unit of time. Multiple reset voltages may be sampled and converted during the reset readout phase using the ASAR algorithm to complete the CMS conversions. In FIG. 4, $V_{r1}$, $V_{r2}$, and so on, up to reset sample $V_{rx}$, correspond to the set of sampled reset voltage in the CMS conversion. Each reset ADC conversion corresponds to $conv_{r1}$, $conv_{r2}$ and so on up to final reset conversion $conv_{rx}$.

Each conversion, 'conv' phase has a sample phase followed by either the standard full N-bit SAR convert phase or M-bit Adaptive SAR convert phase.

Next, after the reset conversions are completed, switch TxA closes, while the switch TxB is open. The integrated charge accumulated on PD-A is transferred to the floating diffusion FD at the gate of source as the FD voltage, and then buffered by the SF onto the column line Vcol as the PD-A voltage level. Then the switch TxA opens, and a standard full N-trial SAR ADC conversion is completed, which corresponds to $conv_{a1}$ in FIG. 4, where $V_{a1}$ corresponds to the first sampled PD-A voltage level. Further M-trial conversions can then be completed in the CMS conversion, by sampling the PD-A voltage on Vcol, corresponding to $V_{a2}$. Each PD-A ADC conversion in the CMS corresponds to $conv_{a1}$, $conv_{a2}$, and so on, up to final PD-A conversion $conv_{ax}$, shown in FIG. 4.

Once all conversions are complete for PD-A, next, the switch TxB closes, while the switch TxA is open. The charge from the PD-B is transferred to the floating diffusion FD at gate of the SF and onto the column line as the PD-B voltage level, and then the TxB switch opens.

When an image acquired by the PDAF image sensor is in focus or is close to being in focus, the voltage readout from PD-B should be substantially similar to PD-A, and the (N-M) MSB trials can be set. Then up to reduced M-trial SAR ADC conversions can be completed to complete the CMS conversions, where each conversion applies the modified SAR algorithm to only convert the M LSBs and then use the set (N-M) MSBs to get the full N-bit values, as described with reference to FIG. 3. The PD-B sampled voltages correspond to $V_{b1}$, $V_{b2}$ in FIG. 3 and so on upto final PD-B sampled voltage $V_{bx}$, (not shown in FIG. 3), and the ADC conversion correspond to $conv_{b1}$, $conv_{b2}$ (shown in FIG. 3), and so on, up to final conversion $conv_{bx}$ (not specifically shown in FIG. 3).

When an image acquired by the PDAF image sensor is out of focus, the voltage readout from PD-B will be substantially different to that from PD-A, The MSB bit trials from the PD-A conversion will be set for the PD-B conversion, however the SAR algorithm will not be able to converge correctly because the MSBs are not set correctly for this sampled voltage, and therefore the ADC conversion will produce an incorrect/invalid digital value.

In this case, a subset of the LSBs will over-range, and this over-range condition can be detected by an over-range detect controller 228 (shown in FIG. 2) observing the output digital code Dout, and checking against known over-range code. The ADC may be configured to revert to a full conversion of N-bit trials for the next conversion, see $conv_{b2}$ in FIG. 4, to ensure that the PD-B voltage is correctly determined. Subsequent conversions can use MSB bits from this $conv_{b2}$ conversion, and therefore use reduced bit trials of only M LSBs, corresponding to $conv_{b3}$ in FIG. 4.

Once the data level samples are complete, the average of the reset samples and the average of the PD-A and PD-B data samples may be calculated. The difference between the average of the data samples from the PD-A and PD-B and the average of the reset sample is the final conversion result produced by the ADC 108.

Figure 5:
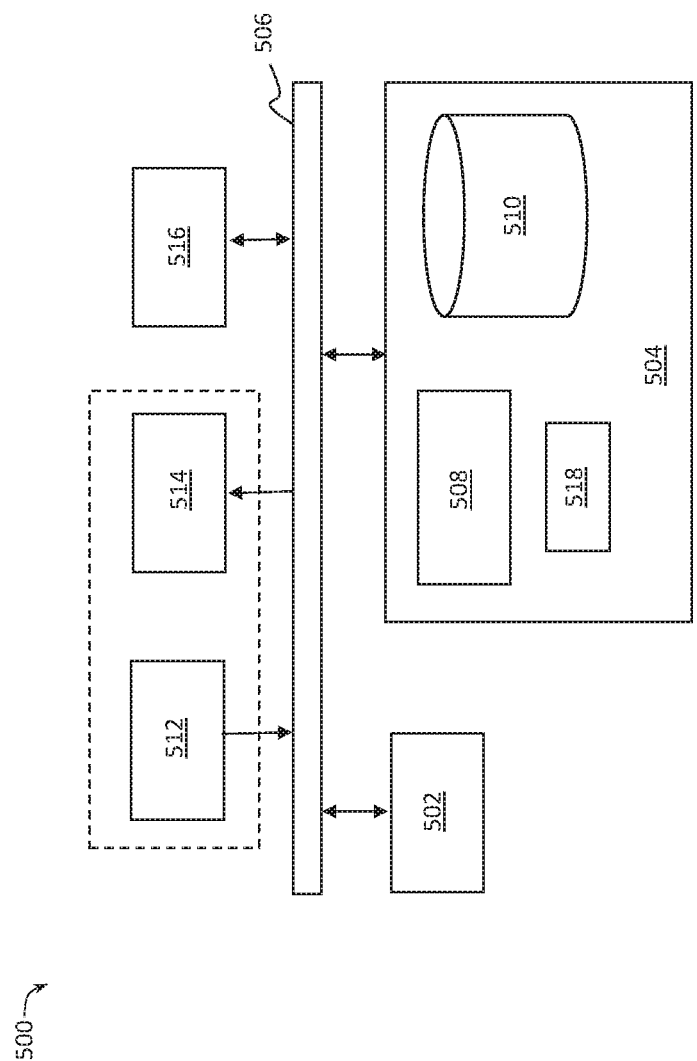
FIG. 5 depicts a block diagram illustrating an example data processing system, according to some embodiments of the present disclosure.

FIG. 5 depicts a block diagram illustrating an example data processing system 500, according to some embodiments of the present disclosure. Such a data processing system could be configured to e.g., function as a controller configured to control implementation of various improved analog-to-digital conversion mechanisms in PDAF image sensors as described herein. For example, the data processing system 500 may be used to implement one or more of the PDAF logic 110, the A-SAR 218, and the over-range detect controller 228 described above.

As shown in FIG. 5, the data processing system 500 may include at least one processor 502 coupled to memory elements 504 through a system bus 504. As such, the data processing system may store program code within memory elements 504. Further, the processor 502 may execute the program code accessed from the memory elements 504 via a system bus 506. In one aspect, the data processing system may be implemented as a computer that is suitable for storing and/or executing program code. It should be appreciated, however, that the data processing system 500 may be implemented in the form of any system including a processor and a memory that is capable of performing the functions described within this specification.

The memory elements 504 may include one or more physical memory devices such as, for example, local memory 508 and one or more bulk storage devices 510. The local memory may refer to RAM or other non-persistent memory device(s) generally used during actual execution of the program code. A bulk storage device may be implemented as a hard drive or other persistent data storage device. The processing system 500 may also include one or more cache memories (not shown) that provide temporary storage of at least some program code in order to reduce the number of times program code must be retrieved from the bulk storage device 510 during execution.

Input/output (I/O) devices depicted as an input device 512 and an output device 514, optionally, can be coupled to the data processing system. Examples of input devices may include, but are not limited to, a keyboard, a pointing device such as a mouse, or the like. Examples of output devices may include, but are not limited to, a monitor or a display, speakers, or the like. Input and/or output devices may be coupled to the data processing system either directly or through intervening I/O controllers.

In an embodiment, the input and the output devices may be implemented as a combined input/output device (illustrated in FIG. 5 with a dashed line surrounding the input device 512 and the output device 514). An example of such a combined device is a touch sensitive display, also sometimes referred to as a "touch screen display" or simply "touch screen". In such an embodiment, input to the device may be provided by a movement of a physical object, e.g., a stylus or a finger of a user, on or near the touch screen display.

A network adapter 516 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 500, and a data transmitter for transmitting data from the data processing system 500 to said systems, devices and/or networks. Modems, cable modems, and Ethernet cards are examples of different types of network adapter that may be used with the data processing system 500.

As pictured in FIG. 5, the memory elements 504 may store an application 518. In various embodiments, the application 518 may be stored in the local memory 508, the one or more bulk storage devices 510, or apart from the local memory and the bulk storage devices. It should be appreciated that the data processing system 500 may further execute an operating system (not shown in FIG. 5) that can facilitate execution of the application 518. The application 518, being implemented in the form of executable program code, can be executed by the data processing system 500, e.g., by the processor 502. Responsive to executing the application, the data processing system 500 may be configured to perform one or more operations or method steps related to implementation of various improved mechanisms of ADCs in PDAF image sensors as described herein.

Variations and Implementations

While embodiments of the present disclosure were described above with references to example implementations as shown in FIGS. 1-5, a person skilled in the art will realize that the various teachings described above are applicable to a large variety of other implementations. For example, while some descriptions provided in the present disclosure refer to SAR ADC directly connected to the column line in the image sensor array in which the sampling capacitor is part of an ADC, these descriptions are equally applicable to a readout signal chain in which there is pre-amplifier before the ADC which samples the Vcol voltage, apply signal again and then holding it while SAR ADC samples again. Also some aspects of the adaptive SAR with CMS described for dual pixel designs will be applicable for a signal pixel readout signal chain in which a SAR ADC is used to digitize the reset and signal voltages using CMS.

In certain contexts, the features discussed herein can be applicable to automotive systems, safety-critical industrial applications, medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions.

In the discussions of the embodiments above, components of a system, e.g., switches, multiplexers, storage arrays, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to various improved mechanisms for analog-to-digital conversion in PDAF image sensors.

Parts of various systems for implementing improved ADCs in PDAF image sensors as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits which may be used in FIGS. 1-2 may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of FIGS. 1-2 may be implemented as stand-alone modules (e.g., a device with associated components and circuitry configured to perform a specific application or function) or implemented as plug-in modules into application specific hardware of electronic devices. Note that particular embodiments of the present disclosure implementing improved mechanisms for analog-to-digital conversion in PDAF image sensors may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of improved ADC mechanisms proposed herein may be implemented in one or more silicon cores in ASICs, FPGAs, and other semiconductor chips.

It is also imperative to note that all of the specifications, dimensions, and relationships outlined herein (e.g., the number of processors, logic units, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of FIGS. 1-2 and 5 may be combined in various possible configurations, all of which are clearly within the broad scope of this specification. In certain cases, it may be easier to describe one or more of the functionalities of a given set of flows by only referencing a limited number of electrical elements. It should be appreciated that the electrical circuits of FIGS. 1-2 and its teachings are readily scalable and can accommodate a large number of components, as well as more complicated/sophisticated arrangements and configurations. Accordingly, the example embodiments provided herein should not limit the scope or inhibit the broad teachings of the electrical circuits as potentially applied to a myriad of other architectures.

Note that in this specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the improved mechanisms for analog-to-digital conversion in PDAF image sensors as proposed herein illustrate only some of the possible functions that may be executed by, or within, system illustrated in FIGS. 1-2 and 5. Some of these operations may be deleted or removed where appropriate, or these operations may be modified or changed considerably without departing from the scope of the present disclosure. In addition, the timing of these operations may be altered considerably, and may differ from those shown in FIGS. 3-4. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the apparatus described above may also be implemented with respect to the method or process described herein and specifics in the examples may be used anywhere in one or more embodiments.

Select Examples

Following paragraphs summarize some example aspects of the present disclosure.

Example 1 provides a PDAF image sensor system that includes an array of pixel cells configured to acquire an image, each pixel cell comprising a first and a second light sensor; and an ADC configured to determine, for each of one or more of the pixel cells, a first N-bit digital value representative of a first analog voltage value indicative of a charge detected by the first light sensor, where N is an integer greater than 1, and a second N-bit digital value representative of a second analog voltage value indicative of a charge detected by the second light sensor. Such determination may includes determining the first N-bit digital value by applying a first SAR algorithm to determine N bits of the first N-bit digital value, determining the second N-bit digital value by applying a second SAR algorithm to determine only M LSB of the second N-bit digital value, and combining the M LSB of the second N-bit digital value with (N-M) most significant bits of the first N-bit digital value to generate the second N-bit digital value.

Example 2 provides the PDAF image sensor according to example 1, further comprising a control logic configured to control whether the PDAF image sensor operates in an image readout mode or in an autofocus readout mode.

Example 3 provides the PDAF image sensor according to example 2, wherein, the control logic is configured to determine a digital value for the pixel cell based on the first N-bit digital value and the second N-bit digital value when the PDAF image sensor operates in the image readout mode.

Example 4 provides the PDAF image sensor according to example 3, wherein determining the digital value for the pixel cell based on the first N-bit digital value and the second N-bit digital value comprises determining the digital value for the pixel cell as an average of the first N-bit digital value and the second N-bit digital value.

Example 5 provides the PDAF image sensor according to example 2, wherein, the control logic is configured to determine whether the second N-bit digital value is valid.

Example 6 provides the PDAF image sensor according to example 5, wherein, when the control logic determines that the second N-bit digital value is not valid, the control logic is configured to discard the second N-bit digital value, and enable the ADC to determine a third N-bit digital value representative of the second analog voltage value indicative of the charge detected by the second light sensor by applying the SAR algorithm to determine the N bits of the third N-bit digital value.

Example 7 provides the PDAF image sensor according to example 6, wherein the PDAF image sensor is configured to implement CMS, and wherein the second N-bit digital value is a digital value of a first sample for the image, and the third N-bit digital value is a digital value of a second sample for the same image.

Example 8 provides the PDAF image sensor according to any one of the preceding examples, wherein determining the first N-bit digital value comprises applying the first SAR algorithm to determine N bits of the first N-bit digital value for a first sample and further applying the second SAR algorithm to determine only M LSB of the first N-bit digital value for one or more subsequent samples.

Example 9 provides the PDAF image sensor according to example 8, further comprising combining the M LSB of the first N-bit digital value for at least some of the one or more subsequent samples with (N-M) MSB of the first N-bit digital value from the first sample to generate one or more samples of the first N-bit digital values.

Example 10 provides the PDAF image sensor according to any one of the preceding examples, wherein determining the second N-bit digital value comprises applying the second SAR algorithm to determine only M LSB of the second N-bit digital value for a plurality of samples. In this manner, CMS with adaptive SAR may be implemented.

Example 11 provides the PDAF image sensor according to example 10, further comprising combining the M LSB of the second N-bit digital value for each of the plurality of samples with (N-M) MSB of the first N-bit digital value to generate a plurality of samples of the second N-bit digital values.

Example 12 provides a phase-detection autofocus (PDAF) image sensor system that includes an array of pixel cells configured to acquire an image, each pixel cell comprising a first and a second light sensor; and an ADC configured to determine, for each of one or more of the pixel cells, a first N-bit digital value representative of a first analog voltage value indicative of a charge detected by the first light sensor, where N is an integer greater than 1, and a second N-bit digital value representative of a second analog voltage value indicative of a charge detected by the second light sensor. Such determination may include applying an adaptive SAR algorithm to determine only M LSB of the first N-bit digital value, applying the adaptive SAR algorithm to determine only M LSB of the second N-bit digital value, combining the M LSB of the first N-bit digital value with set (N-M) most significant bits to generate N bits of the first N-bit digital value, and combining the M LSB of the second N-bit digital value with set (N-M) most significant bits to generate N bits of the second N-bit digital value.

Example 13 provides a method for implementing analog-to-digital conversion as described herein in a PDAF image sensor system.

Example 14 provides a non-transitory computer-readable storage medium comprising logic that includes instructions for execution, which instructions, when executed by a processor, are operable to perform the method for implementing analog-to-digital conversion in a PDAF image sensor system as described herein.

Example 15 provides an ADC system comprising means for implementing analog-to-digital conversion as described herein.

Example 16 provides a PDAF image sensor comprising means for performing readout operations, including analog-to-digital conversion as described herein.

The invention claimed is:

1. A phase-detection autofocus (PDAF) image sensor system, comprising:
an array of pixel cells configured to acquire an image, each pixel cell comprising a first and a second light sensor; and
an analog-to-digital converter (ADC) configured to determine, for each of one or more of the pixel cells, a first N-bit digital value representative of a first analog signal value indicative of a charge detected by the first light sensor, where N is an integer greater than 1, and a second N-bit digital value representative of a second analog signal value indicative of a charge detected by the second light sensor, wherein said determination includes:
determining the first N-bit digital value by applying a first successive approximation register (SAR) algorithm to determine N bits of the first N-bit digital value, and
determining the second N-bit digital value by applying a second SAR algorithm to determine only M least significant bits (LSB) of the second N-bit digital value, where M is an integer equal to or greater than 1 and smaller than N, and combining the M LSB of the second N-bit digital value with (N-M) most significant bits (MSB) of the first N-bit digital value to generate the second N-bit digital value so that the (N-M) MSB of the second N-bit digital value are the (N-M) MSB of the first N-bit digital value and the M LSB of the second N-bit digital value are the M LSB determined by applying the second SAR algorithm.

2. The PDAF image sensor according to claim 1, further comprising a control logic configured to control whether the PDAF image sensor operates in an image readout mode or in an autofocus readout mode.

3. The PDAF image sensor according to claim 2, wherein, the control logic is configured to determine a digital value for the pixel cell based on the first N-bit digital value and the second N-bit digital value when the PDAF image sensor operates in the image readout mode.

4. The PDAF image sensor according to claim 3, wherein determining the digital value for the pixel cell based on the first N-bit digital value and the second N-bit digital value comprises determining the digital value for the pixel cell as an average of the first N-bit digital value and the second N-bit digital value.

5. The PDAF image sensor according to claim 2, wherein, the control logic is configured to determine whether the second N-bit digital value is valid.

6. The PDAF image sensor according to claim 5, wherein, when the control logic determines that the second N-bit digital value is not valid, the control logic is configured to:
   discard the second N-bit digital value, and
   enable the ADC to determine a third N-bit digital value representative of the second analog signal value indicative of the charge detected by the second light sensor by applying the SAR algorithm to determine the N bits of the third N-bit digital value.

7. The PDAF image sensor according to claim 6, wherein the PDAF image sensor is configured to implement correlated multiple sampling (CMS), and wherein the second N-bit digital value is a digital value of a first sample for the image, and the third N-bit digital value is a digital value of a second sample for the same image.

8. The PDAF image sensor according to claim 1, wherein determining the first N-bit digital value comprises applying the first SAR algorithm to determine N bits of the first N-bit digital value for a first sample and further applying the second SAR algorithm to determine only M LSB of the first N-bit digital value for one or more subsequent samples.

9. The PDAF image sensor according to claim 8, further comprising combining the M LSB of the first N-bit digital value for at least some of the one or more subsequent samples with (N-M) MSB of the first N-bit digital value from the first sample to generate one or more samples of the first N-bit digital values.

10. The PDAF image sensor according to claim 1, wherein determining the second N-bit digital value comprises applying the second SAR algorithm to determine only M LSB of the second N-bit digital value for a plurality of samples.

11. The PDAF image sensor according to claim 10, further comprising combining the M LSB of the second N-bit digital value for each of the plurality of samples with (N-M) MSB of the first N-bit digital value to generate a plurality of samples of the second N-bit digital values.

12. The PDAF image sensor according to claim 1, wherein the first analog signal value is a first analog voltage value, and the second analog signal value is a second analog voltage value.

13. The PDAF image sensor according to claim 1, further comprising a power supply.

14. An image sensor system, comprising:
   a pixel cell comprising a pair of light sensors; and
   one or more circuits configured to determine a first N-bit digital value representative of a first analog signal value indicative of a charge detected by a first light sensor of the pair, where N is an integer greater than 1, and a second N-bit digital value representative of a second analog signal value indicative of a charge detected by a second light sensor of the pair, wherein said determination includes:
      applying an adaptive successive approximation register (SAR) algorithm to determine only M least significant bits (LSB) of the first N-bit digital value, where M is an integer equal to or greater than 1 and smaller than N,
      applying the adaptive SAR algorithm to determine only M LSB of the second N-bit digital value,
      combining the M LSB of the first N-bit digital value with set (N-M) most significant bits (MSB) to generate N bits of the first N-bit digital value so that the (N-M) MSB of the first N-bit digital value are the set (N-M) MSB and the M LSB of the first N-bit digital value are the M LSB of the first N-bit digital value determined by applying the adaptive SAR algorithm, and
      combining the M LSB of the second N-bit digital value with the set (N-M) MSB to generate N bits of the second N-bit digital value so that the (N-M) MSB of the second N-bit digital value are the set (N-M) MSB and the M LSB of the second N-bit digital value are the M LSB of the second N-bit digital value determined by applying the adaptive SAR algorithm.

15. The image sensor according to claim 14, further comprising:
   one or more circuits configured to determine a digital value for the pixel cell based on the first N-bit digital value and the second N-bit digital value.

16. The image sensor according to claim 15, wherein determining the digital value includes determining the digital value as an average of the first N-bit digital value and the second N-bit digital value.

17. The image sensor according to claim 14, wherein the first analog signal value is a first analog voltage value, and the second analog signal value is a second analog voltage value.

18. A method for implementing analog-to-digital conversion in a phase-detection autofocus image sensor system that includes an array of pixel cells configured to acquire an image, each pixel cell including a first light sensor and a second light sensor, the method comprising:
   determining, for each of one or more of the pixel cells, a first N-bit digital value representative of a first analog signal value indicative of a charge detected by the first light sensor, where N is an integer greater than 1, and a second N-bit digital value representative of a second analog signal value indicative of a charge detected by the second light sensor,
   wherein said determination includes:
      applying an adaptive successive approximation register (SAR) algorithm to determine only M least significant bits (LSB) of the first N-bit digital value,
      applying the adaptive SAR algorithm to determine only M LSB of the second N-bit digital value, where M is an integer equal to or greater than 1 and smaller than N,
      combining the M LSB of the first N-bit digital value with set (N-M) most significant bits (MSB) to generate N bits of the first N-bit digital value so that the (N-M) MSB of the first N-bit digital value are the set (N-M) MSB and the M LSB of the first N-bit digital value are the M LSB of the first N-bit digital value determined by applying the adaptive SAR algorithm, and combining the M LSB of the second N-bit digital value with the set (N-M) MSB to generate N bits of the second N-bit digital value so that the (N-M) MSB of the second N-bit digital value are the set (N-M) MSB and the M LSB of the second N-bit digital value are the M LSB of the second N-bit digital value determined by applying the adaptive SAR algorithm.

19. The method according to claim 18, further comprising:

when the second N-bit digital value is determined to be valid, determining a digital value for the pixel cell as an average of the first N-bit digital value and the second N-bit digital value.

20. The method according to claim 18, further comprising:

when the second N-bit digital value is determined to not be valid, determining a third N-bit digital value representative of the second analog signal value indicative of the charge detected by the second light sensor by applying the SAR algorithm to determine the N bits of the third N-bit digital value.

* * * * *